United States Patent
Ito

(10) Patent No.: US 7,907,250 B2
(45) Date of Patent: Mar. 15, 2011

(54) IMMERSION LITHOGRAPHY METHOD

(75) Inventor: Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 731 days.

(21) Appl. No.: 11/861,376

(22) Filed: Sep. 26, 2007

(65) Prior Publication Data

US 2008/0079919 A1   Apr. 3, 2008

(30) Foreign Application Priority Data

Sep. 29, 2006   (JP) .................... 2006-268074

(51) Int. Cl.
*G03B 27/52* (2006.01)
*G03B 27/44* (2006.01)
*G03B 27/68* (2006.01)
*G03B 27/42* (2006.01)
*G03B 27/32* (2006.01)

(52) U.S. Cl. ............... 355/30; 355/46; 355/52; 355/53; 355/77

(58) Field of Classification Search .......... 355/30, 355/46, 52, 53, 77, 40, 72–74; 250/492.1, 250/492.2, 492.22, 493.1, 548; 430/5, 8, 430/22, 30, 311, 312, 322
See application file for complete search history.

(56) References Cited

U.S. PATENT DOCUMENTS

| | | | |
|---|---|---|---|
| 5,955,738 A * | 9/1999 | Manabe et al. | 250/492.22 |
| 6,266,144 B1 * | 7/2001 | Li | 356/401 |
| 6,351,304 B1 * | 2/2002 | Kawashima et al. | 355/55 |
| 6,586,168 B1 * | 7/2003 | Ohsaki | 430/394 |
| 7,125,652 B2 | 10/2006 | Lyons et al. | |
| 2002/0002415 A1 * | 1/2002 | Mugibayashi et al. | 700/110 |
| 2002/0031725 A1 * | 3/2002 | Sugita et al. | 430/311 |
| 2004/0121246 A1 * | 6/2004 | Brown | 430/5 |
| 2005/0248741 A1 | 11/2005 | Kawamura et al. | |
| 2005/0259234 A1 * | 11/2005 | Hirukawa et al. | 355/53 |
| 2006/0082747 A1 | 4/2006 | Fukuhara et al. | |
| 2006/0082748 A1 | 4/2006 | Schmidt et al. | |
| 2006/0126044 A1 | 6/2006 | Mizutani et al. | |
| 2006/0194155 A1 * | 8/2006 | Kawamura et al. | 430/394 |
| 2007/0048678 A1 * | 3/2007 | Chen et al. | 430/394 |
| 2007/0153247 A1 * | 7/2007 | Nagasaka | 355/53 |
| 2007/0156379 A1 * | 7/2007 | Kulkarni et al. | 703/14 |
| 2007/0188733 A1 * | 8/2007 | Ito et al. | 355/77 |

FOREIGN PATENT DOCUMENTS

JP   10-303114   11/1998
JP   2005-109426   4/2005

OTHER PUBLICATIONS

B.J. Lin, 193-nm Immersion Lithography for 65-nm and Below, $2^{nd}$ Immersion Symposium, 2005, pp. 1-27, Belgium.

* cited by examiner

*Primary Examiner* — Peter B Kim
*Assistant Examiner* — Christina Riddle
(74) *Attorney, Agent, or Firm* — Finnegan, Henderson, Farabow, Garrett & Dunner, L.L.P.

(57) ABSTRACT

An immersion lithography method includes forming a resist layer on a substrate to be processed, performing immersion lithography in a state where liquid is locally interposed between the resist layer on the substrate and an optical system of an exposure apparatus, while the substrate and the optical system are relatively moved. In the immersion lithography, multiple exposures are performed for exposure regions in a portion of a surface of the substrate close to a rim of the substrate, and exposures of number of times smaller than the number of exposures of the multiple exposures are performed for exposure regions located inside the exposure regions.

16 Claims, 5 Drawing Sheets

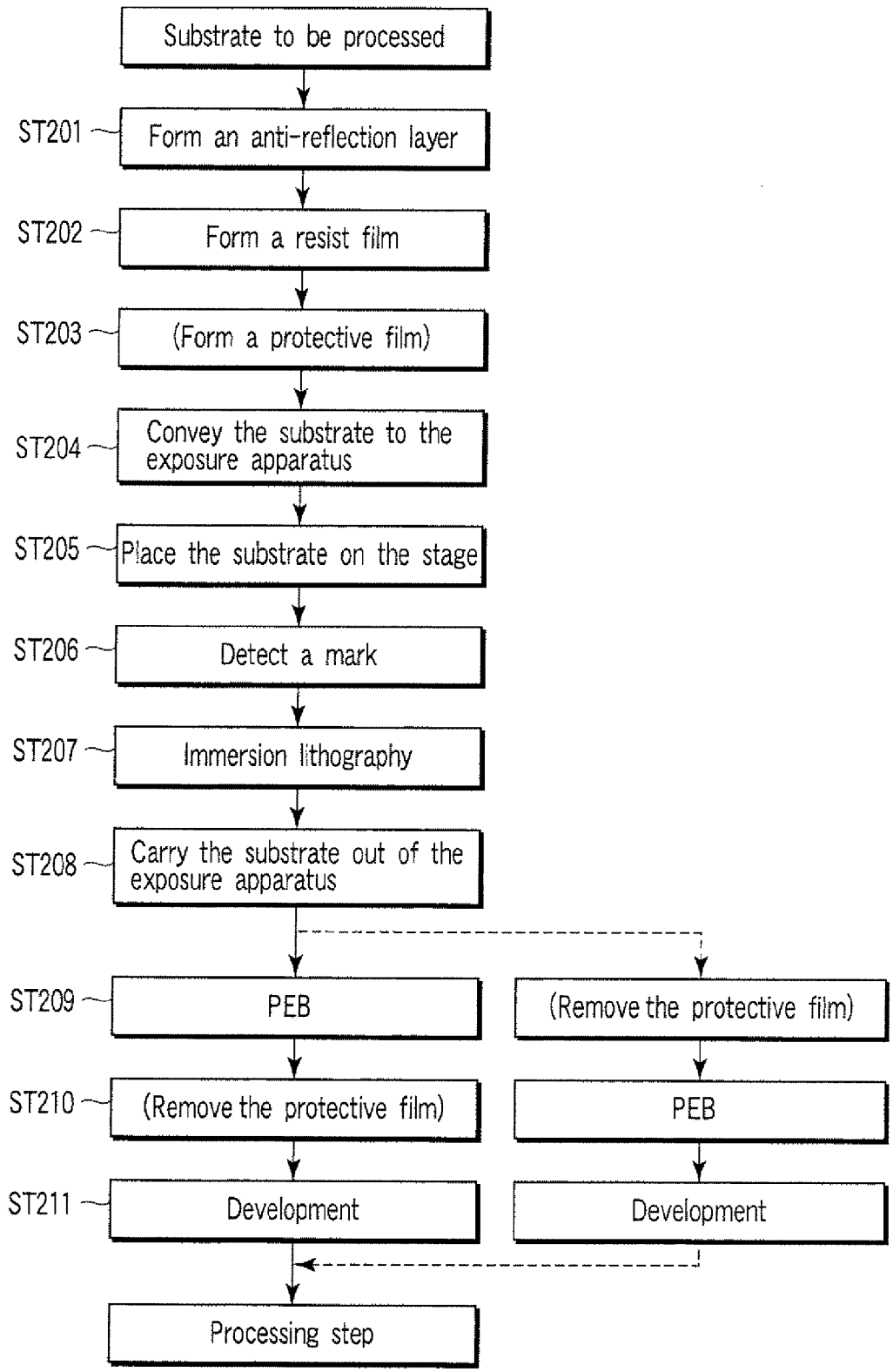
F I G. 2

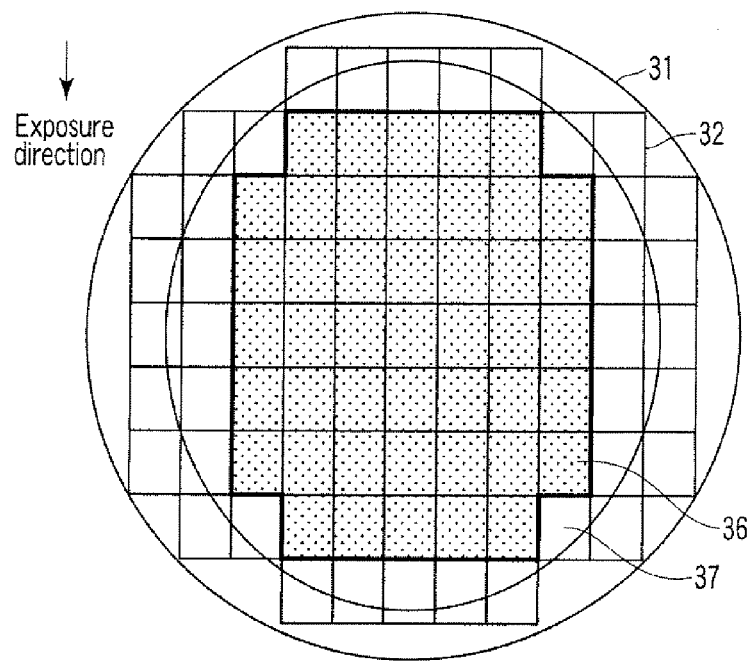
F I G. 7
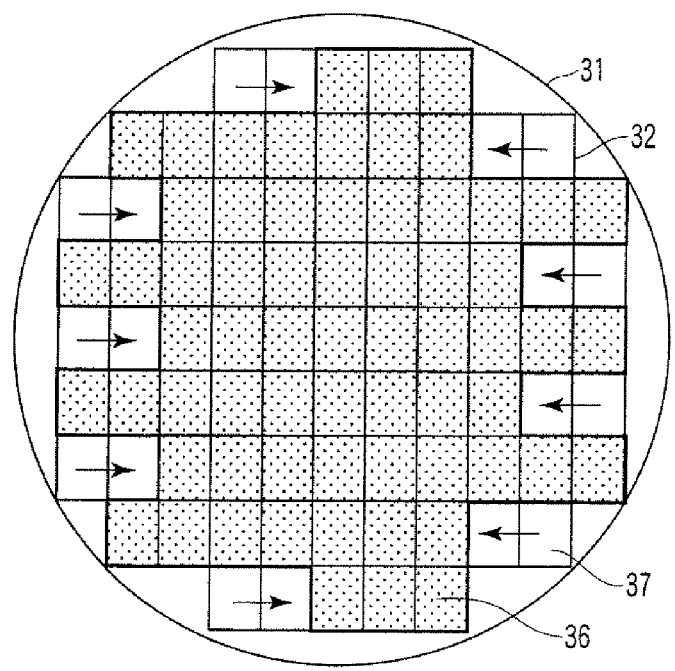
F I G. 8

US 7,907,250 B2

IMMERSION LITHOGRAPHY METHOD

CROSS-REFERENCE TO RELATED APPLICATIONS

This application is based upon and claims the benefit of priority from prior Japanese Patent Application No. 2006-268074, filed Sep. 29, 2006, the entire contents of which are incorporated herein by reference.

BACKGROUND OF THE INVENTION

1. Field of the Invention

This invention relates to an exposure method in a lithography technique used for semiconductor manufacturing, in particular, an immersion lithography method in which exposure is performed in a state where liquid is interposed between lens of an exposure apparatus and a substrate to be processed.

2. Description of the Related Art

In recent years, immersion lithography has received much attention. Immersion lithography is a method in which exposure is performed by filling liquid into a space between a surface of a resist film and a lens of an exposure apparatus when the resist film is subjected to exposure. To perform this method, there is proposed an immersion lithography apparatus (Jpn. Pat. Appln. KOKAI Pub. No. 10-303114), wherein the whole substrate to be processed is submerged in water in a stage to which water is supplied, and exposure is performed while the stage is moved. However, in the apparatus, since liquid is supplied to the whole stage, there is the problem that liquid is disturbed or spilled from the stage when the stage is moved at high speed. Therefore, the apparatus has the problem that the stage cannot be driven at high speed.

As a countermeasure against disturbance of liquid due to movement of the stage, there is disclosed a method of driving the stage while liquid is locally supplied to a part which is subjected to exposure (Jpn. Pat. Appln. KOKAI Pub. No. 2005-109426). In this method, to move the liquid film, which is locally interposed between the surface of the film and the lens, at high speed for immersion lithography, the surface of the resist is rendered water-repellant, or a water-repellant film is provided on the surface of the resist. This enables the stage to relatively move at high speed with respect to the optical system.

However, the immersion lithography of this type has the following problem. Specifically, there is the problem that defects occur in a resist pattern due to remaining liquid drips and localized air bubbles in immersion lithography. Further, these defects tend to occur in portions close to an edge of the substrate to be processed.

As described above, immersion lithography, in which exposure is performed while the immersed region is moved on the resist film, has the problem that defects occur in a resist pattern due to remaining liquid droplets and localized air bubbles in immersion lithography, and cause deterioration in accuracy of pattern dimensions.

BRIEF SUMMARY OF THE INVENTION

According to an aspect of the present invention, there is provided an immersion lithography method in which an immersed region is locally formed in a substrate to be processed, and exposure is performed while the immersed region is moved on the substrate to be processed, comprising:

forming a resist layer on the substrate; and performing immersion lithography in a state where is liquid is locally interposed between the resist layer with/without immersion protective layer on the substrate and an optical system of an exposure apparatus, while the substrate and the optical system are relatively moved, performing multiple exposures for exposure regions in a portion on a surface of the substrate close to a rim of the substrate, and performing exposures for exposure regions located inside the exposure regions with number of times smaller than number of exposures of the multiple exposures.

According to another aspect of the invention, there is provided an immersion lithography method in which an immersed region is locally formed in a substrate to be processed, and exposure is performed while the immersed region is moved on the substrate to be processed, comprising:

forming a resist layer on the substrate, the resist layer being formed of a resist film and an immersion protective film; and performing immersion lithography in a state where liquid is locally interposed between the resist layer on the substrate and an optical system of an exposure apparatus, while the substrate and the optical system are relatively moved, performing multiple exposures consisting of n exposures for exposure regions in a portion of a surface of the substrate close to a rim of the substrate with exposure dose energy of E/n (E is a necessary exposure dose energy, and n is a number of times), and performing single exposure for exposure regions located inside the exposure regions with an exposure amount of E.

According to another aspect of the invention, there is provided a method of forming a resist pattern, comprising:

forming a resist layer on a substrate to be processed;

performing immersion lithography in a state where liquid is locally interposed between the resist layer on the substrate and an optical system of an exposure apparatus, while the substrate and the optical system are relatively moved, performing multiple exposures for exposure regions in a portion of a surface of the substrate close to a rim of the substrate, and performing exposures for exposure regions located inside the exposure regions with number of times smaller than number of exposures of the multiple exposures; and subjecting the exposed substrate to development, and thereby forming a resist pattern on the resist layer.

BRIEF DESCRIPTION OF THE SEVERAL VIEWS OF THE DRAWING

FIG. 2 is a flowchart illustrating the lithography method according to the first embodiment.

FIG. 7 is a diagram for explaining a second embodiment, illustrating an example of setting exposure regions for single exposure and multiple exposures.

FIG. 8 is a diagram for explaining a second embodiment, illustrating an example of setting exposure regions for single exposure and multiple exposures.

DETAILED DESCRIPTION OF THE INVENTION

The present invention is explained in detail with reference to embodiments illustrated in drawings.

FIRST EMBODIMENT

Figure 1:
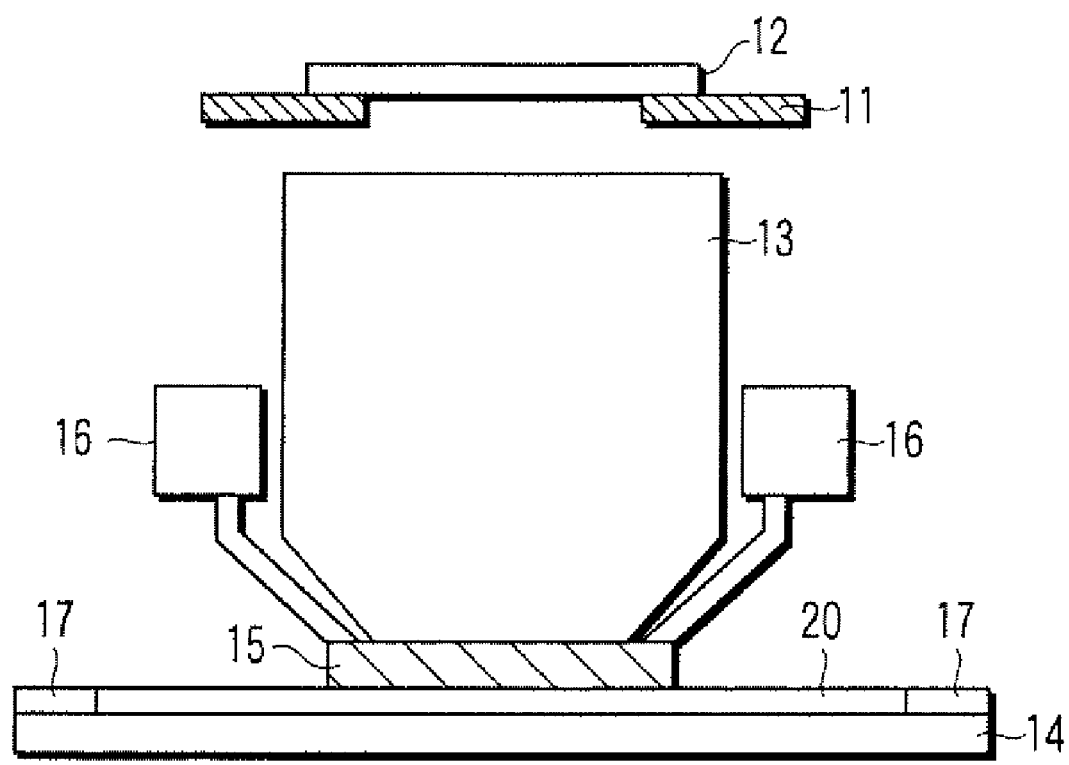
FIG. 1 is a diagram illustrating a schematic structure of an immersion lithography apparatus used for an immersion lithography method according a first embodiment of the present invention.

FIG. 1 is a diagram illustrating a schematic structure of an immersion lithography apparatus (scan exposure system) used for an immersion lithography method according to a first embodiment of the present invention.

A reticle stage 11 which is movable in a horizontal direction is disposed below an illumination optical system (not shown). A reticle 12 on which an LSI pattern is formed is placed on the reticle stage 11.

A projection lens system 13 to scale down and project the pattern of the reticle 11 is disposed below the reticle stage 11. A sample stage 14 which is movable in the horizontal direction is disposed below the projection lens system 13. A semiconductor substrate (substrate to be processed) 14 to be subjected to immersion lithography is placed on the stage 14. Further, a support board 17 to reduce the difference in level by an edge portion of the substrate 20 is provided around the semiconductor substrate 20.

A fence 15 which prevents an immersion liquid from going out of the immersed region is attached to the bottom portion of the projection lens system 13. Further, a pair of water supplier and discharger 16, which supplies water (a first chemical solution) into the fence 15 and discharges water from the fence 15, respectively, are provided on side portions of the projection lens system 13.

In the above structure, a space between a part of the substrate 20 surrounded by the fence 15 and the projection lens system 13 is filled with a water liquid film (immersed region) when exposure is performed. Exposure light emitted from the projection lens system 13 passes through the immersed region and reaches a radiation region. An image of a mask pattern (not shown) on the reticle 12 is projected onto a part of the photoresist on the surface of the substrate corresponding to the radiation region, and a latent image is formed thereon. Then, the immersed region is successively relatively moved, and thereby the whole exposure region on the substrate 20 is subjected to exposure.

Next, a lithography (exposure) method using the above scan exposure apparatus is explained with reference to the flowchart of FIG. 2.

A coating material for an anti-reflection film is supplied onto a semiconductor substrate, and spread over the semiconductor substrate by rotating the substrate. Then, the coating material is heated, and thereby an anti-reflection film having a thickness of about 50 nm is formed (step ST201). Next, an ArF chemically-amplified resist film containing an acid generator is formed with a thickness of 200 nm on the anti-reflection film (step ST202). The chemically amplified resist is formed by the following process. Specifically, a coating material for the chemically-amplified resist is spread over the anti-reflection film by spin coating. Then, the material is heated, and thereby a solvent contained in the coating material is removed.

Since the surface of the chemically-amplified resist used in the embodiment is relatively hydrophilic, a immersion protective hydrophobic film which is soluble in an alkaline developer is formed on the resist film. The immersion protective film suppresses infiltration of water from the immersion liquid into the resist film, and elution of a resist component substance from the resist into the immersion liquid (step ST203).

Next, the semiconductor substrate is transfer to the immersion lithography apparatus of scan-exposure type illustrated in FIG. 1 (step ST204), and placed on the stage 14 (step ST205).

Thereafter, a mark position on the semiconductor substrate is detected (step ST206), and then the exposure of the substrate is performed with respect to the pattern, and a latent image is formed on the resist film (step ST207).

Figure 3:
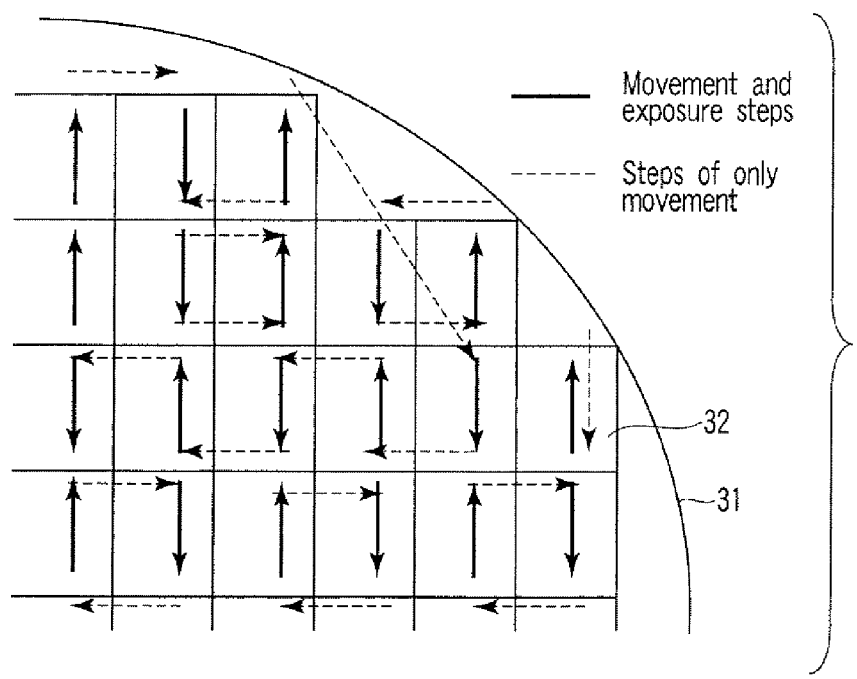
FIG. 3 is a diagram illustrating movement directions of an exposure region in a ¼ surface of a semiconductor substrate.

FIG. 3 is a diagram illustrating moving directions of the exposure region in a ¼ surface of a semiconductor substrate. Arrows of solid lines in FIG. 3 indicate moving directions of the immersed region in scan exposure, and arrows of broken lines indicate moving directions of the immersed region when exposure is not performed. Reference numeral 31 in FIG. 3 denotes a semiconductor substrate (substrate to be processed), and reference numeral 32 denotes one exposure region, for example, an exposure region corresponding to one chip (several chips in some cases).

Figure 4:
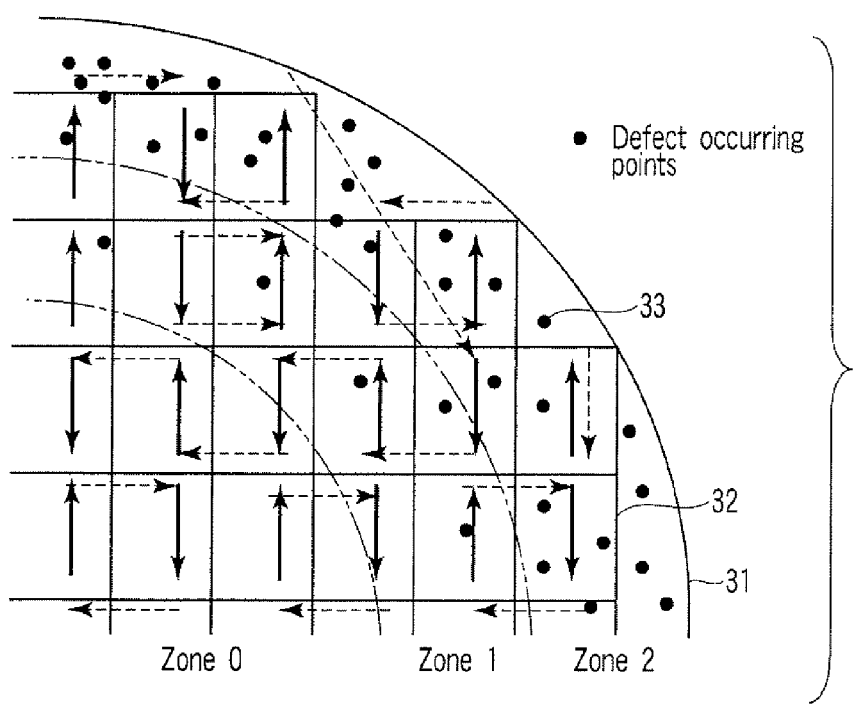
FIG. 4 is a diagram illustrating a relationship between movement steps and defect occurring positions in an exposure process.

Exposure is performed with the movements illustrated in FIG. 3. FIG. 4 illustrates a distribution of defects of the patterned substrate after exposure, which is superposed on FIG. 3. Black dots in FIG. 4 indicate positions of defects 33. It has been proved that black dots are mainly distributed in the vicinity of the rim of the substrate. It has been proved that these defects 33 are latent image distortions. The latent image distortions are generated by exposing the pattern with air bubbles, which are taken from the air existing in the border between the semiconductor substrate 31 and the support board 17 of the lithography apparatus located at the same level as the substrate 31 when the immersed region passes through the support board 17. Further, the defects 33 are latent image distortions or dark portions generated by exposing the substrate with minute particles floating in the vicinity of the substrate in the immersed region.

These factors move with movement of the immersed region and movement of the liquid in the immersed region (caused by liquid supply/discharge), and are referred to as mobile factors herein. It has been reported that defects caused by mobile factors can be reduced as the number of times of exposures increases (B. J. Lin, 2nd immersion symposium (2006, Belgium)).

In the case of performing multiple exposures, an exposure amount per exposure is small, and defects due to mobile factors by one exposure are reduced. Although the number of defects increases by performing a plurality of exposures, each defect is small and ignorable. Specifically, performing multiple exposures disperses defects caused by mobile factors, and consequently suppresses occurrence of defects.

However, performing multiple exposures in the whole surface of the substrate enormously increases the exposure time (not exposure amount but time required for exposure, i.e. exposure time, settling time, motion from die to die of exposure, etc.) per substrate, and greatly reduces the throughput.

Therefore, the inventors of the present invention pursued close research on defects, and found the following fact. Air bubbles being one of causes of defects have the property of dissolving in liquid with a lapse of time. Therefore, air bubbles gradually become small with a lapse of time, and disappear in the end. Therefore, it has been proved that defects are gradually reduced, although defects due to air bubbles occur when exposure is started from the rim of the substrate. Further, minute particles taken by a bevel or the like are discharged from the immersed region to the discharger with a lapse of time. Therefore, it has been proved that defects are gradually reduced like defects caused by air bubbles, although defects occur when exposure is started from the rim of the substrate.

Therefore, multiple exposures are not indispensable for all the shots, but may be performed for chips in inside portions close to the rim of the substrate. The other shots may be performed with single exposure. On the basis of the distribution of defects illustrated in FIG. 4, the whole exposure region is divided into three zones according to the defect generation amount. Specifically, the zones are defined by borderlines, which are located at regular intervals around the center of the substrate.

Figure 5:
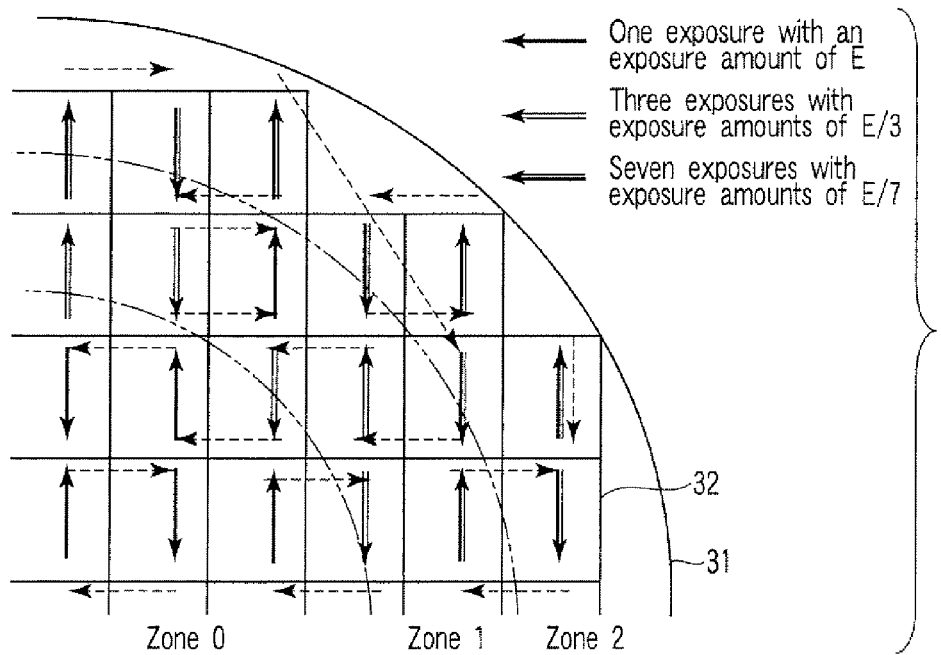
FIG. 5 is a diagram illustrating the number of exposures in each of the movement steps.

Zone 0 is a region in which a density of defects due to mobile factors, that is, the number of defects per 1 cm$^2$ is 0.1 or less. Zone 2 is a region having frequent defects caused by mobile factors. Zone 1 is a region having defect of a number about midway between Zone 0 and Zone 2. Based on the distribution, as illustrated in FIG. 5, one exposure, three multiple exposures, and seven multiple exposures were performed for each shot for only Zone 0, each shot including Zone 1, and each shot including Zone 2, respectively. The exposure dose energy of the one exposure, three multiple exposures, and seven multiple exposures were E, E/3, and E/7, respectively.

The semiconductor substrate subjected to the above processing is conveyed to a baker (step ST208), and the substrate is subjected to heating (PEB) (step ST209). Thereby, diffusion of acid generated in the exposure step and amplification are performed, and then the substrate is cooled. Thereafter, the substrate is conveyed to a developing unit to perform development, thereby the protective film on the resist is removed (step ST210), and an ArF resist pattern is formed (step ST211).

FIG. 5 also illustrates the state of defects on the substrate after formation of a resist pattern. In FIG. 5, no black dots are shown, and defects were eliminated in all the regions from Zone 0 to Zone 2 located in the peripheral portion of the substrate. Specifically, it has been proved that defects due to mobile factors in immersion lithography are suppressed. Further, even after patterning following exposure, no defects were found in all the regions from Zone 0 to Zone 2 located in the peripheral portion of the substrate.

As described above, according to the embodiment of the present invention, when a semiconductor substrate is subjected to immersion lithography, multiple exposures (for example, seven exposures) are performed in a region close to the rim on the surface of the substrate, single exposure is performed in the central portion (Zone 0) on the surface of the substrate, and three exposures are performed in a region (Zone 1) between the peripheral portion and the central portion. Thereby, it is possible to achieve exposure, which incurs very few defects caused by movement of the immersed region and prevents remaining liquid drips from infiltrating into the resist film. Therefore, it is possible to suppress occurrence of defects of a resist pattern due to remaining liquid droplets and localized air bubbles in immersion lithography, and perform highly reliable processing as a device having good pattern dimension accuracy.

Further, since only a part of the substrate is subjected to multiple exposures instead of performing multiple exposures for the whole substrate, reduction in throughput is suppressed to a minimum. Furthermore, wire patterns and transistors manufactured through exposure and processing according to the method of this embodiment have no defects, and have good properties.

SECOND EMBODIMENT

In the first embodiment described above, Zones 0, 1 and 2 are defined by borderlines which are located at regular intervals around the center of the substrate. However, the present invention is not limited to it. In the second embodiment, a method of determining zones is explained.

Figure 6:
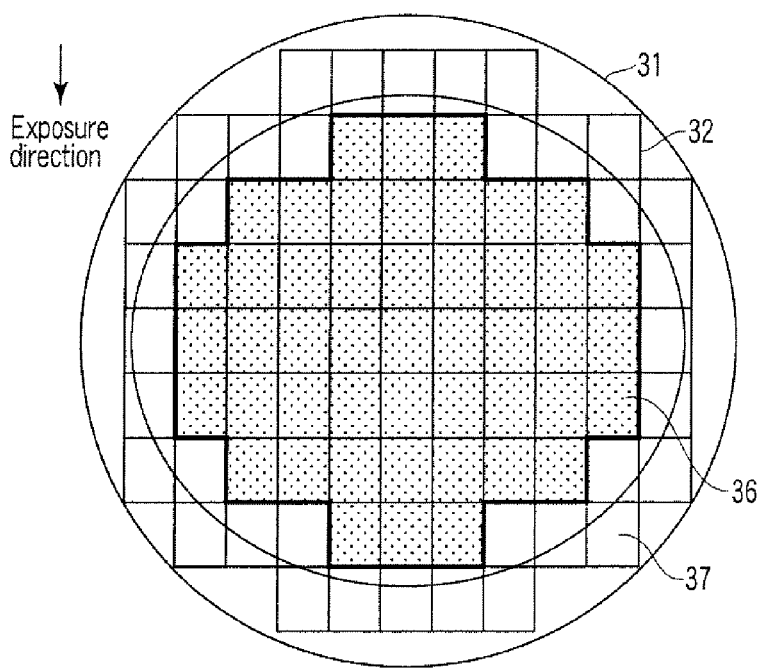
FIG. 6 is a diagram for explaining a second embodiment, illustrating an example of setting exposure regions for single exposure and multiple exposures.

As illustrated in FIG. 6, if a defect-occurring zone is wide in a portion where a substrate edge tangent line is perpendicular to the exposure direction (the direction in which the immersed region moves), multiple-exposure region are determined by dividing the substrate into zones by an elliptical area having a minor axis in the direction in which the substrate edge tangent is perpendicular to the exposure direction. Shaded exposure regions 36 in FIG. 6 are single-exposure regions, and exposure regions 37 which are not shaded and located in the peripheral portion are multiple-exposure regions.

Further, as illustrated in FIG. 7, if a defect-occurring zone is wide in a portion where a substrate edge tangent line is parallel with the exposure direction, multiple-exposure regions are determined by dividing the substrate into zones by an elliptical area having a minor axis in the direction in which the substrate edge tangent is parallel with the exposure direction. Shaded exposure regions 36 in FIG. 7 are single-exposure regions, and exposure regions 37 which are not shaded and located in the peripheral portion are multi-exposure regions.

Further, as illustrated in FIG. 8, a position where the immersed region contacts the edge of the substrate is set as a base point, and a few shots after the base point may be set as multiple-exposure regions. This is an example adopted in the case where there are many defects in the vicinity of the exposure starting point of each line.

Arrows in FIG. 8 indicate the traveling direction of the immersed region for each shot. In the example of FIG. 8, multiple exposures are performed for first two exposure regions from a base point, which is in the position where the immersed region contacts the edge. Shaded exposure regions 36 in FIG. 8 are single-exposure regions, and peripheral exposure regions 37 which are not shaded are multiple-exposure regions. As in this example, it is preferable to determine the number of exposure regions subjected to multiple exposures from the base point, according to the distribution of defects. If distribution of defects varies line by line, the number of exposure regions subjected to multiple exposures may be determined for each line.

The above methods also produce the same effect as that of the above first embodiment, as a matter of course.

(Modifications)

The present invention is not limited to the above embodiments. The materials and thicknesses of the resist film, the anti-reflection film, and the immersion protective film used in the embodiments can be changed according to specifications. Further, although an immersion protective film is formed on the resist film in the embodiments, the immersion protective film can be omitted if the resist film is sufficiently hydrophobic. Further, the anti-reflection film can also be omitted.

There is another form of steps ST209 to ST210 explained in the first embodiment. For example, if a protective film soluble in a solvent is used, it is preferable that the protective film is removed by a solvent after PEB, and then development of the resist is performed by an alkaline developer. Further, as indicated by broken lines in FIG. 2, the protective film may be removed before PEB if required, and then PEB and development may be performed.

Additional advantages and modifications will readily occur to those skilled in the art. Therefore, the invention in its broader aspects is not limited to the specific details and representative embodiments shown and described herein. Accordingly various modifications may be made without departing from the spirit or scope of the general inventive concept as defined by the appended claims and their equivalents.

What is claimed is:

1. An immersion lithography method in which an immersed region is locally formed in a substrate to be processed, and exposure is performed while the immersed region is moved on the substrate to be processed, comprising:
    forming a resist layer on the substrate; and
    performing immersion lithography in a state where liquid is locally interposed between the resist layer on the substrate and an optical system of an exposure apparatus, while the substrate and the optical system are relatively moved, determining a plurality of exposure regions based on how many defects are caused by the immersion lithography, determining a number of times multiple exposure should be performed for each of the exposure regions such that the multiple exposure is performed a larger number of times for an exposure region containing a larger number of defects, and performing exposure for each of the exposure regions by the number of times determined.

2. An immersion lithography method according to claim 1, wherein
    the resist layer is formed of a resist film, or a resist film and an immersion protective film formed on the resist film.

3. An immersion lithography method according to claim 1, wherein
    the multiple exposure is performed for a first exposure region located near an outer periphery of a surface of the substrate, and exposure is performed for a second exposure region by a fewer number of times than the number of times the multiple exposure is performed.

4. An immersion lithography method according to claim 3, wherein
    each exposure amount of the multiple exposures is controlled to a predetermined exposure amount, for the exposure regions subjected to the multiple exposures.

5. An immersion lithography method according to claim 3, wherein
    multiple exposures are performed for each of the exposure regions in the portion of the surface of the substrate close to the rim of the substrate, and one exposure is performed for each of the exposure regions located inside the exposure regions.

6. An immersion lithography method according to claim 5, wherein
    an exposure amount of one exposure of the regions subjected to multiple exposures consisting of n exposures is set to E/n, when an exposure amount for the regions subjected to one exposure is defined as E.

7. An immersion lithography method according to claim 1, wherein
    single exposure is performed for each of exposure regions in which the number of defects per 1 $cm^2$ is 0.1 or less.

8. An immersion lithography method according to claim 1, wherein
    two exposure regions closest to a starting point of each line of an exposure direction are subjected to the multiple exposure.

9. A method of forming a resist pattern, comprising:
    forming a resist layer on a substrate to be processed;
    performing immersion lithography in a state where liquid is locally interposed between the resist layer on the substrate and an optical system of an exposure apparatus, while the substrate and the optical system are relatively moved, determining a plurality of exposure regions based on how many defects are caused by the immersion lithography, determining a number of times multiple exposure should be performed for each of the exposure regions such that the multiple exposure is performed a larger number of times for an exposure region containing a larger number of defects, and performing exposure for each of the exposure regions by the number of times determined; and
    subjecting the exposed substrate to development, and thereby forming a resist pattern on the resist layer.

10. A method according to claim 9, wherein
    the resist layer is formed of a resist film, or a resist film and an immersion protective film formed on the resist film.

11. A method according to claim 9, wherein
    the multiple exposure is performed for a first exposure region located near an outer periphery of a surface of the substrate, and exposure is performed for a second exposure region by a fewer number of times than the number of times the multiple exposure is performed.

12. A method according to claim 11, wherein
    two exposure regions closest to a starting point of each line of an exposure direction are subjected to the multiple exposure.

13. A method according to claim 11, wherein
    each exposure amount of the multiple exposures is controlled to a predetermined exposure amount, for the exposure regions subjected to the multiple exposures.

14. A method according to claim 11, wherein
    multiple exposures are performed for each of the exposure regions in the portion of the surface of the substrate close to the rim of the substrate, and one exposure is performed for each of the exposure regions located inside the exposure regions.

15. A method according to claim 14, wherein
    an exposure amount of one exposure of the regions subjected to multiple exposures consisting of n exposures is set to E/n, when an exposure amount for the regions subjected to single exposure is defined as E.

16. A method according to claim 9, wherein
    single exposure is performed for each of exposure regions in which the number of defects per 1 $cm^2$ is 0.1 or less.

* * * * *